(12) United States Patent
Kuo et al.

(10) Patent No.: US 9,535,785 B2
(45) Date of Patent: Jan. 3, 2017

(54) ECC METHOD FOR FLASH MEMORY

(71) Applicant: Macronix International Co., Ltd., Hsinchu (TW)

(72) Inventors: Nai-Ping Kuo, Hsinchu (TW); Shih-Chang Huang, Hsinchu (TW); Chin-Hung Chang, Hsinchu (TW); Ken-Hui Chen, Hsinchu (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 230 days.

(21) Appl. No.: 14/158,613

(22) Filed: Jan. 17, 2014

(65) Prior Publication Data

US 2015/0205665 A1    Jul. 23, 2015

(51) Int. Cl.
*G06F 11/10* (2006.01)
*G11C 16/34* (2006.01)

(52) U.S. Cl.
CPC ....... *G06F 11/1048* (2013.01); *G11C 16/3436* (2013.01); *G06F 2212/1036* (2013.01)

(58) Field of Classification Search
CPC .. G11C 29/00; G11C 16/3436; G06F 11/1048; G06F 2212/1036
See application file for complete search history.

(56) References Cited

U.S. PATENT DOCUMENTS

| | | | |
|---|---|---|---|
| 4,005,405 A | 1/1977 | West | |
| 4,888,773 A | 12/1989 | Arlington et al. | |
| 6,526,537 B2 | 2/2003 | Kishino | |
| 6,883,131 B2 * | 4/2005 | Acton | G11B 20/18 714/755 |
| 7,051,260 B2 | 5/2006 | Ito et al. | |
| 7,196,644 B1 | 3/2007 | Anderson et al. | |
| 7,355,892 B2 | 4/2008 | Hemink | |
| 7,823,044 B2 * | 10/2010 | Simon | G11C 16/10 714/746 |
| 7,921,339 B2 | 4/2011 | Chen et al. | |
| 8,149,748 B2 | 4/2012 | Bata et al. | |
| 8,286,066 B2 * | 10/2012 | Bueb | G06F 11/1068 714/801 |
| 9,146,809 B2 | 9/2015 | Huang et al. | |
| 2004/0083334 A1 | 4/2004 | Chang et al. | |
| 2007/0089035 A1 | 4/2007 | Alexander et al. | |

(Continued)

*Primary Examiner* — Steve Nguyen (74) *Attorney, Agent, or Firm* — Yiding Wu; Haynes Beffel & Wolfeld LLP (57) ABSTRACT

A method of operating a memory storing data sets, and ECCs for the data sets is provided. The method includes when writing new data in a data set, computing and storing an ECC, if a number of addressable segments storing the new data and data previously programmed in the data set includes at least a predetermined number of addressable segments. The method includes storing indications for whether to enable or disable use of the ECCs, using the ECC and a first additional ECC bit derived from the ECC. The method includes reading from a data set an extended ECC including an ECC and a first additional ECC bit derived from the ECC, and enabling or disabling use of the ECC according to the indications stored for the data set. The method includes enabling use of ECCs for blank data sets, using the indications and a second additional ECC bit.

19 Claims, 5 Drawing Sheets

(56) References Cited

U.S. PATENT DOCUMENTS

| | | | |
|---|---|---|---|
| 2008/0158984 A1* | 7/2008 | Mokhlesi | G11C 11/5642 365/185.21 |
| 2011/0055647 A1* | 3/2011 | Maeda | G06F 11/1048 714/719 |
| 2011/0066923 A1 | 3/2011 | Koshiyama et al. | |
| 2011/0283054 A1 | 11/2011 | Kozakai et al. | |
| 2013/0019051 A1 | 1/2013 | Somanache et al. | |
| 2013/0036276 A1 | 2/2013 | Radovic et al. | |
| 2013/0080856 A1* | 3/2013 | Bueb | G06F 11/1048 714/766 |
| 2013/0262958 A1* | 10/2013 | Ruggiero | G06F 11/10 714/763 |

* cited by examiner

FIG. 1

Partial Data Set Program Operations

ECC METHOD FOR FLASH MEMORY

BACKGROUND

Field

The present invention relates to memory devices and systems including error correction code (ECC) logic.

Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values (i.e. endurance) in the presence of disturbance of the memory cell state caused by high speed and high volume accesses to the memory cells and to neighboring memory cells can be limited by the tighter margins.

To address issues like those that arise from tighter margins and memory cell disturbance as these technologies scale in size and density, use of error correcting codes (ECCs) embedded with integrated circuit memory has become more widespread.

Flash memory is usually configured so that it can be erased a block at a time by a block erase. When a block is erased, memory cells in the block are set to one logic value, such as 1. After a block is erased, memory cells in the block can be programmed to a different value, such as 0. Once a memory cell is programmed to 0, the memory cell can be changed back to 1 by a block erase of the block including the programmed memory cell. Once some memory cells in a block, such as cells in a selected byte or word in the block, are programmed to 0 during a first program operation, other memory cells in a different byte or word in the same block that are known to be in the erased state, can still be programmed to 0 during a second program operation without requiring a pre-erase of the block. A block erase, followed by a first program operation and the second program operation to different locations in the same block can be referred to as double patterning for the purpose of this description. Of course, the block erase operations could be followed by many program operations (more than two) when each program operation is directed to a different part of the block to accomplish a "multiple patterning operation."

In a double or multiple patterning operation, an error correction code (ECC) can be computed and programmed at a particular location in the block during the first program operation. However, the ECC cannot be changed safely for the second program operation in a memory that relies on block erase. The ECC cannot be safely changed in the second program operation because a re-computed ECC may require changing 0 (programmed state) to 1 (erased state) for at least one bit in the ECC, and that change could require a block erase that would erase data in the entire block.

It is desirable to provide a solution for reliably controlling utilization of ECC logic for error detection and correction for double patterning and multiple patterning operations.

SUMMARY

A method of operating a memory includes storing data sets (e.g. pages) including a plurality of addressable segments (e.g. words or bytes), and error correcting codes ECCs for the data sets in the memory. When writing new data in one of the addressable segments of a selected data set in the memory, an ECC can be computed and stored for the selected data set, if a number of addressable segments storing the new data and data previously programmed in the selected data set includes at least a predetermined number of addressable segments. The predetermined number can be all of addressable segments in the selected data set.

Indications can be stored with the data sets that indicate whether to enable or disable use of the ECCs stored with the data sets. The indications can be provided by storing extended ECCs (e.g. xtECC[9:0] for 128-bit data), including a field for the ECCs (e.g. xtECC[7:0] for 128-bit data) for the data sets, a field for a first additional ECC bit (e.g. xtECC[8]) derived from the ECC, and a field for a second additional ECC bit (e.g. xtECC[9]). The first additional ECC bit can be derived by executing a logical exclusive-OR function on the ECC. The extended ECCs can indicate whether to enable or disable use of the ECCs stored with the data sets.

The extended ECCs can have a first predetermined value (e.g. 9'h000 for 128-bit data), for the first additional bit and the ECCs, indicating a first state to disable use of the data in the field for the ECCs, a second predetermined value (e.g. 9'h1C0 for 128-bit data), for the first additional bit and the ECCs, indicating a second state in which the extended ECCs originally have a computed value equal to the first predetermined value, and a computed value indicating a third state including computed ECCs in the field for the ECCs and a bit in the field for the first additional ECC bit derived from the computed ECC.

The method includes using a computed value for an extended ECC for the selected data set, if a number of addressable segments storing the new data and data previously programmed in the selected data set includes at least a predetermined number (e.g. all) of addressable segments, and an error condition does not occur in which the selected data set is already programmed at the addressable segment for the new data.

The method includes setting the extended ECC to the first predetermined value, thereby indicating disabling use of the ECCs stored with the selected data set, if the selected data set is previously programmed at the addressable segment for the new data. The method includes setting the extended ECC to the second predetermined value, if the extended ECC equals the first predetermined value and the selected data set is not programmed at the addressable segment for the new data.

The method further includes setting the second additional ECC bit to a value to indicate the selected data set is programmed in at least one addressable segment. A blank or unprogrammed state can result from a block erase of the data set such that an ECC at the blank ECC state includes all "1s". The first additional ECC bit also includes a value '1' after a block erase. A computed value for an ECC can also be all "1s", while the first additional ECC bit for the ECC should have a value '0' as described herein. However, in case of a retention error, the first additional ECC bit can be mistakenly changed to '1'. In that case, for the purposes of determining whether use of ECCs should be enabled, a read operation cannot tell whether the ECC with a value of all "1s" and the first additional ECC bit with a value "1" are computed values or at erased states. The second additional ECC bit is thus used to indicate whether the selected data set is programmed in at least one addressable segment.

An extended ECC (e.g. xtECC[9:0] for 128-bit data) including an ECC (e.g. xtECC[7:0] for 128-bit data), a first additional ECC bit (e.g. xtECC[8]), and a second additional ECC bit (e.g. xtECC[9]), can be read from a selected data set, where the first additional ECC bit is derived from the ECC using a logical function. Use of the ECC stored with the selected data set can be enabled, if the logical function of the ECC equals the first additional ECC bit, and the ECC does not equal the first predetermined value indicating the first state to disable use of the ECCs.

The method includes setting the ECC to the first predetermined value (e.g. 9'h000) indicating the first state, and then enabling use of the ECC with the selected data set, if the logical function of the ECC does not equal the first additional ECC bit, and the ECC equals the second predetermined value (e.g. 9'h1C0) indicating the second state in which the ECC originally has a computed value equal to the first predetermined value. The logical function can be a logical exclusive-OR function.

The method includes reading the second additional ECC bit that indicates whether the selected data set is programmed in at least one addressable segment, and enabling use of the ECCs stored with the selected data set, if the logical function of the ECC does not equal the first additional ECC bit, the ECC equals a blank value (e.g. 8'hFF) indicating a blank ECC state, and the second additional ECC bit indicates that the selected data set is programmed in at least one addressable segment. A blank ECC state can result from a block erase of the data set such that an ECC at the blank ECC state is at erased states, such as all "1s". The first and second predetermined values for the first and second states are predetermined to be different than the blank value.

Other aspects and advantages of the present invention can be seen on review of the drawings, the detailed description and the claims, which follow.

DETAILED DESCRIPTION

A detailed description of embodiments of the present invention is provided with reference to the figures.

As the technology for memory cells in integrated circuit memories scales down, the margins for sensing the data can become tighter, and in turn limit the ability of the memory cells to hold data values in the presence of disturbance of the memory cell state caused by high speed and high volume accesses to the memory cells and to neighboring memory cells. To address issues that arise from tighter margins and memory cell disturbance, error correcting codes (ECCs) embedded with integrated circuit memories can be used.

A full data set program operation is a program operation that programs the data set at every address in the data set. When a data set, such as a page of memory cells, is programmed with a full data set program operation, an ECC can be computed for the data set and stored with the data set. A partial data set program operation is a program operation that programs the data set at some but not all addresses in the data set. When a data set is programmed with a first partial data set program operation, an ECC can be computed for the data set and stored with the data set. However, when the data set is programmed with a second partial data set program operation after the first partial data set program operation, the ECC for the data set may not be updated because of reasons explained herein, and thus use of the ECC on a data set programmed with multiple partial data set program operations may fail.

The present technology provides control logic using extended error correcting codes ECCs, including ECCs for data sets, a first additional ECC bit and a second additional ECC bit for each of the data sets, to enable use of ECCs on data sets programmed with multiple partial data set program operations.

Figure 1:
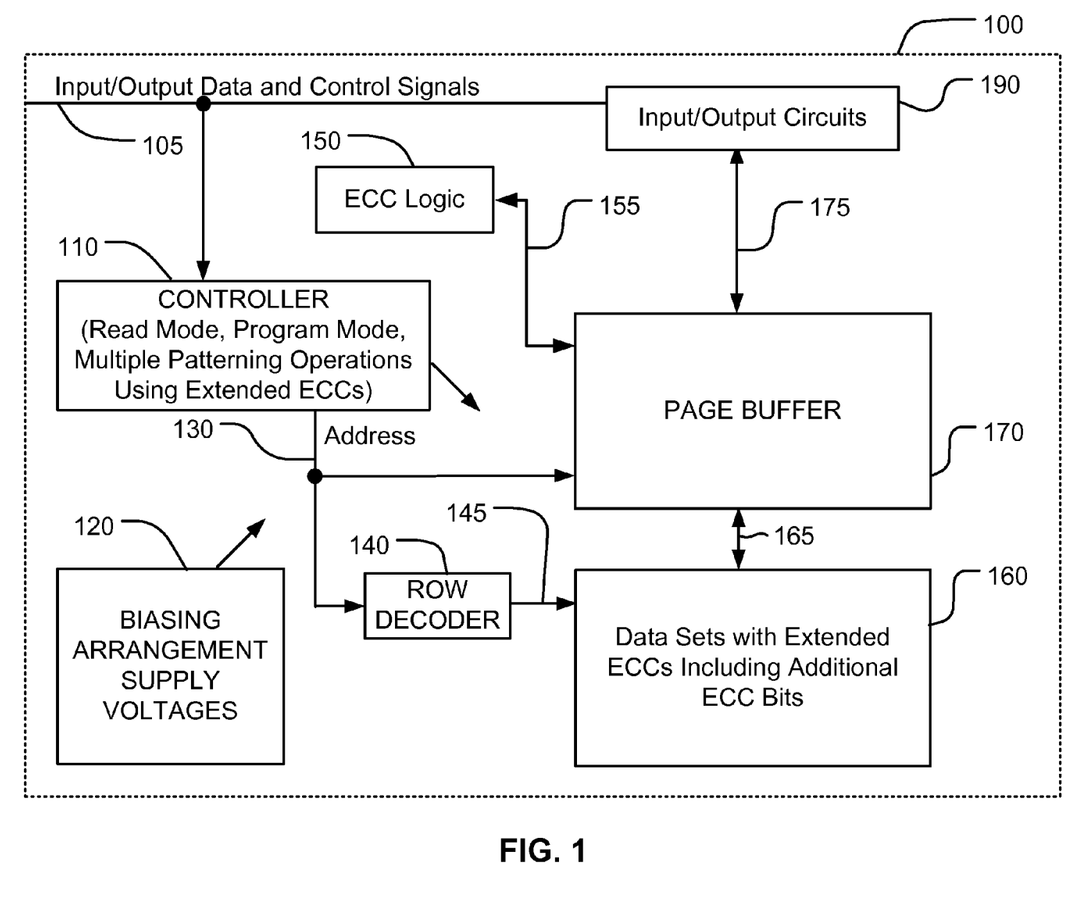
FIG. 1 is a simplified chip block diagram of an integrated circuit memory according to an embodiment.

FIG. 1 is a simplified chip block diagram of an integrated circuit memory according to an embodiment. In the example illustrated in FIG. 1, a memory 100 stores data sets 160 including a plurality of addressable segments, and extended error correcting codes ECCs for the data sets. The extended ECCs include ECCs for data sets, a first additional ECC bit and a second additional ECC bit for each of the data sets.

In the example shown in FIG. 1, a controller 110 using a bias arrangement state machine controls the application of bias arrangement supply voltage generated or provided through the voltage supply or supplies in block 120, such as read and program voltages. The controller 110 is coupled to page buffer 170, ECC logic 150, and the data sets 160 with extended ECCs including first and second additional ECC bits. The ECC logic 150 is coupled to the page buffer 170 via signals 155.

Figure 2:
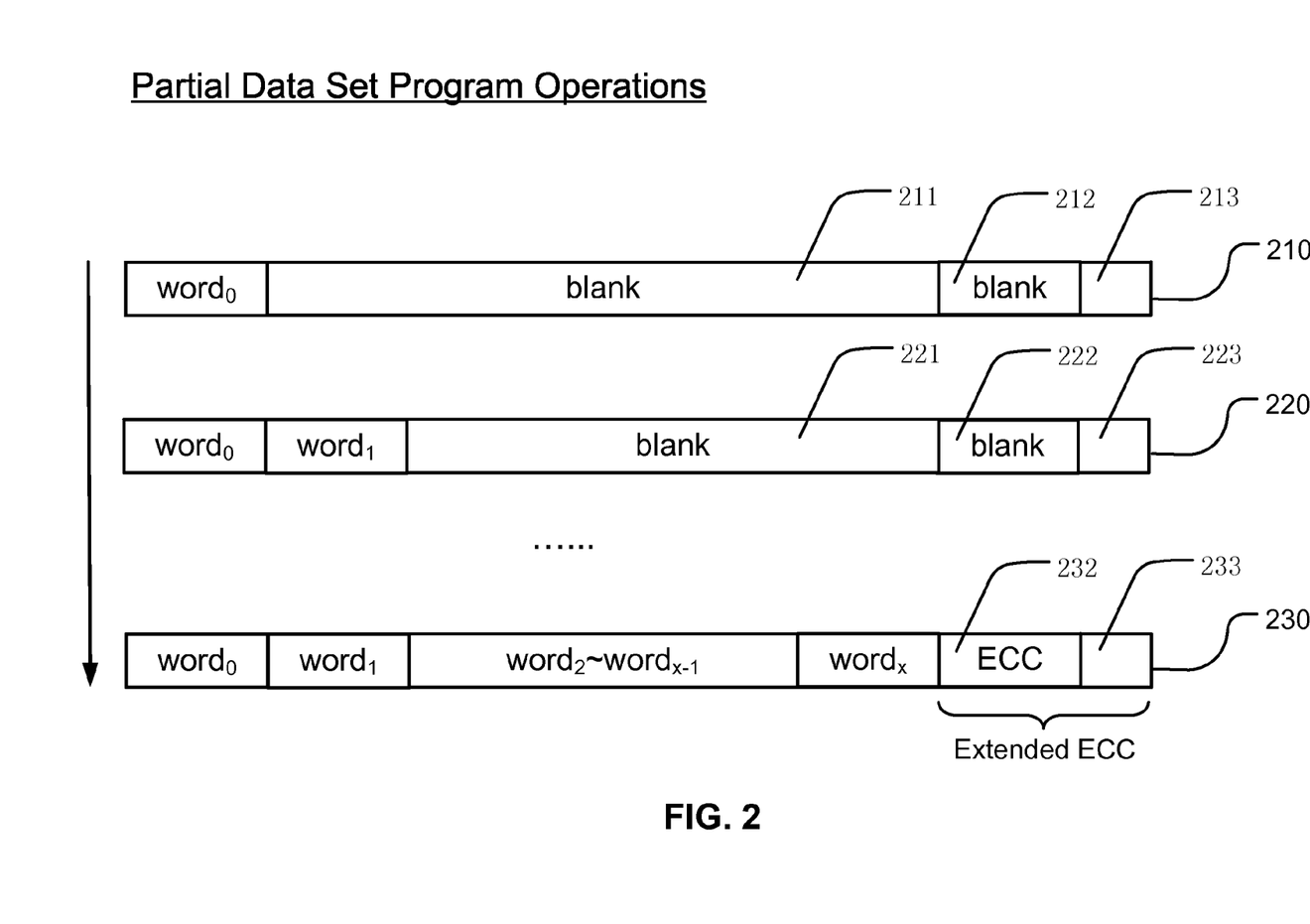
FIG. 2 illustrates partial data set program operations in a memory.

In a program mode, the controller 110 includes logic which when writing new data in one of the addressable segments of a selected data set in the memory, can compute and store an ECC for the selected data set, if a number of addressable segments storing the new data and data previously programmed in the selected data set includes at least a predetermined number of addressable segments. The predetermined number of addressable segments can be all of addressable segments in the selected data set. For example, as illustrated in FIG. 2, for a last partial array operation (e.g. 230), a number of addressable segments storing the new data (e.g. the last word word$_x$) and data previously programmed in the selected data set (e.g. word$_0$ through word$_{x-1}$) includes all of addressable segments in the selected data set. Consequently, an ECC (232) for the selected data set is computed and stored with the selected data set.

Indications can be stored with the data sets that indicate whether to enable or disable use of the ECCs stored with the data sets. Indications can be provided by storing extended ECCs, including a field for the ECCs for the data sets and a field for a first additional ECC bit derived from the ECC. The extended ECCs indicate whether to enable or disable use of the ECC stored with the data sets. The controller 110 includes logic to store a second additional ECC bit for the selected data set to indicate the selected data set is programmed in at least one addressable segment.

In a read mode, the controller 110 includes logic to read an extended ECC including an ECC and a first additional ECC bit from a selected data set, where the first additional ECC bit is derived from the ECC using a logical function. The controller 110 includes logic to enable use of the ECC stored with the selected data set, if the logical function of the ECC equals the first additional ECC bit, and the ECC does not equal a first predetermined value indicating a first state to disable use of the ECCs. The controller 110 includes logic to enable use of the ECC for a blank data set, using the second additional ECC bit.

The controller 110 can be implemented using special-purpose logic circuitry as known in the art. In alternative embodiments, the control logic includes a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

In the example shown in FIG. 1, a row decoder 140 is coupled to a plurality of word lines 145, and arranged along rows in the data sets 160. The page buffer 170 is coupled to a plurality of bit lines 165 arranged along columns in the data sets 160 for reading data from and writing data to the data sets 160. Addresses are supplied on bus 130 from controller 110 to the page buffer, and the row decoder. The page buffer can include a column decoder coupled to the data sets 160 and the bus 130, and sense amplifiers for read operations and a program buffer for program operations coupled to the column decoder. The page buffer is coupled to input/output circuits 190, in this example via a data bus 175. Input/output circuits 190 drive the data to destinations external to the memory 100. Input/output data and control signals are moved via data bus 105 between the input/output circuits, the controller 110 and input/output ports on the memory 100 or other data sources internal or external to the memory 100, such as a general purpose processor or special purpose application circuitry, or a combination of modules providing system-on-a-chip functionality supported by the data sets 160.

FIG. 2 illustrates partial data set program operations in a memory in accordance with the present technology. In the example illustrated in FIG. 2, the memory stores data sets, such as pages. The data sets include a plurality of addressable segments, such as words or bytes, and error correcting codes ECCs for the data sets in the memory. Each data set can also include a first additional ECC bit and a second additional bit. As described in the present application, a data set includes an extended ECC including an ECC for a data set, a first additional ECC bit and a second additional bit. In the example illustrated in FIG. 2, during a first partial data set program operation (e.g. 210), a first word (e.g. $word_0$) is programmed at a first address in a data set, while other addresses in the data set remain unprogrammed (e.g. 211). The ECC for the array (e.g. 212) is not programmed during the first partial data set program operation, and remains at a blank or unprogrammed state. The first additional ECC bit and the second additional bit (e.g. 213) also remain at a blank or unprogrammed state after the first partial data set program operation (e.g. 210).

A blank ECC state can result from a block erase of the data set such that an ECC at the blank ECC state includes erased state values such as all "1s". For example, if an ECC includes 8 bits, then the blank ECC state for the ECC equals "11111111" or erased state values. After a block erase, the ECC can have a blank value (e.g. "11111111") indicating the blank ECC state. The first additional ECC bit and the second additional ECC bit for the data set, as described herein, also can have an erased value such as '1' after a block erase. As an example, an ECC with 8 bits is used for corresponding data of 128 bits, although ECCs can have different numbers of bits for corresponding data of different lengths. For an ECC with 8 bits for a data set, the extended ECC for the data set includes 10 bits, including 8 bits for the ECC, 1 bit for the first additional ECC bit, and 1 bit for the second additional ECC bit.

During a second partial data set program operation (e.g. 220), a second word (e.g. $word_1$) is programmed at a second address in the data set, while other addresses in the data set remain unprogrammed (e.g. 221). The ECC for the data set (e.g. 222) is not programmed during the second partial data set program operation and remains at a blank ECC state. The first additional ECC bit and the second additional bit (e.g. 223) also remain at a blank or unprogrammed state after the second partial data set program operation (e.g. 220).

Additional partial data set program operations can be executed to program more words in the data set until the data set is programmed at all of addresses in the array. As illustrated in FIG. 2, in a last partial array operation (e.g. 230), a last word (e.g. $word_x$) is programmed at a last address in the data set after words (e.g. $word_2$~$word_{x-1}$) in-between the second word (e.g. $word_1$) and the last word (e.g. $word_x$) are programmed in the data set. When the last word (e.g. $word_x$) is programmed in the data set, the ECC for the data set (e.g. 232) is computed and stored with the data set. The first additional ECC bit (e.g. 233) can also be computed and stored with the data set during the last partial data set program operation (e.g. 230). Consequently, during a read operation, use of the ECC stored with the data set can be enabled when the data set is programmed with multiple partial data set program operations. The first additional ECC bit and the second additional bit are further described in connection with FIG. 4 and FIG. 5. In particular, the second additional bit is programmed when at least one of the addresses in the data set is programmed.

In one embodiment, addresses in the data set increase in the direction of the first word to the last word, where the first word is at the lowest address and the last word is at the highest address in the data set. In an alternative embodiment, addresses in the data set increase in the direction of the last word to the first word, where the first word is at the highest address and the last word is at the lowest address in the data set.

Control logic for computing and storing the ECC when the last word in a data set is programmed, and for enabling use of the ECC stored with the data set during a read operation, is described in connection with FIGS. 3, 4, and 5.

Figure 3:
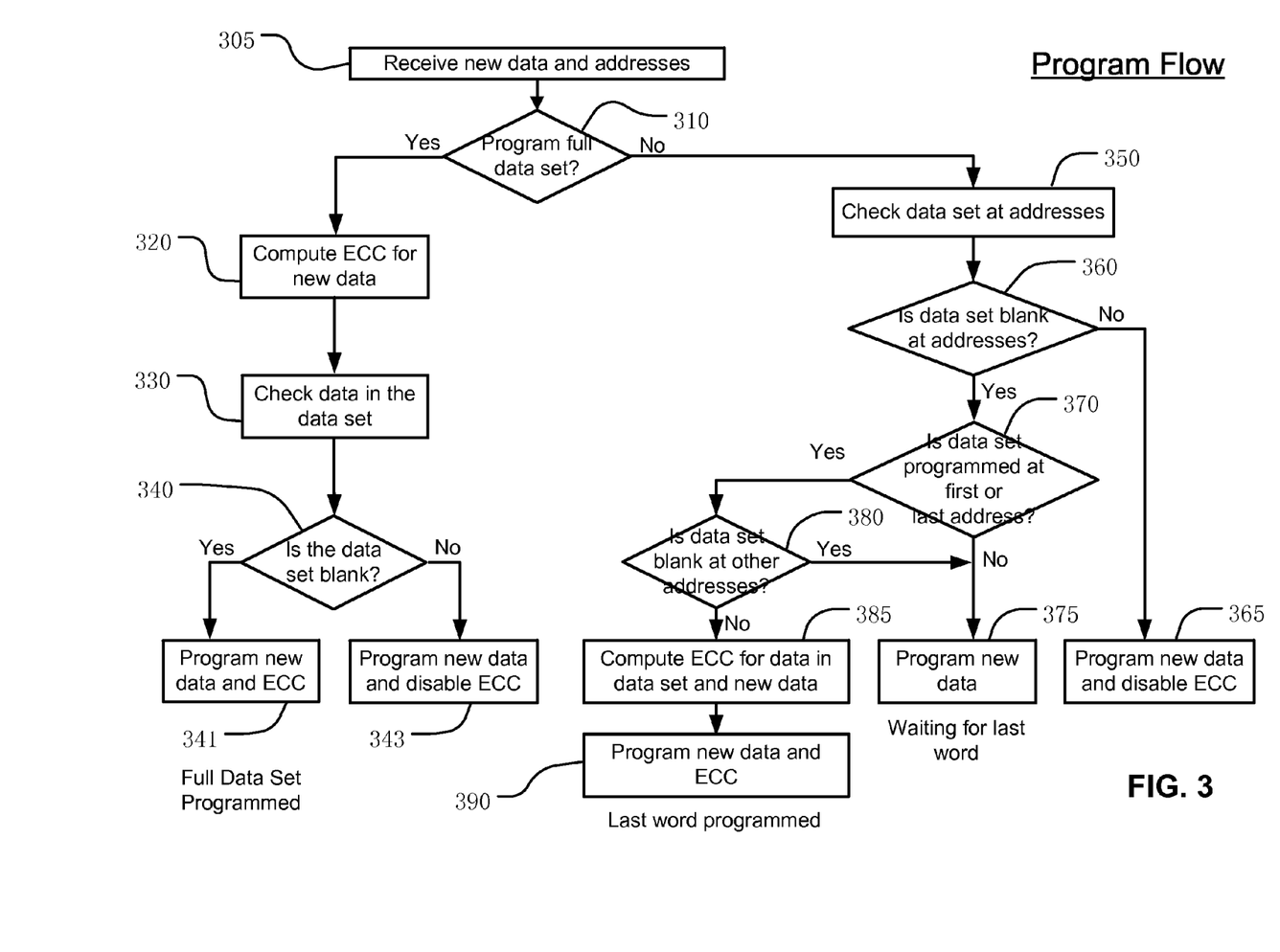
FIG. 3 is a flow chart for program operations in a memory.

FIG. 3 is a flow chart for program operations in a memory. In the example illustrated in FIG. 3, at Step 305, new data for one of the addressable segments of a selected data set in the memory is received. At Step 310, it is determined whether the program operation for the new data is a full data set program operation or a partial data set program operation. If the program operation for the new data is a full data set program operation (Step 310, Yes), then at Step 320 an error correcting code ECC is computed for the new data. At Step 330, the data set is checked for whether the data set is programmed at any addresses. If the data set is not programmed at any addresses, the data set is referred to as blank. If the data set is blank (Step 340, Yes), then at Step 341 the data set is programmed with the new data and the ECC computed for the new data. If the data set is programmed at any address or not blank (Step 340, No), then at Step 343 the data set is programmed with the new data, and the ECC is set to a first predetermined value (e.g. 9'h00) indicating a first state to disable use of the ECC. The first state is further described in connection with FIG. 4. Alternatively, Step 320 to compute the ECC for the new data can be executed after Step 340 when it is determined that the data set is blank and before Step 341 when the ECC is programmed.

If the program operation for the new data is not a full data set program operation but a partial data set program operation (Step 310, No), then at Step 350 the data set is checked for whether the data set is blank or programmed at the addresses for the new data. If the data set is not blank at the addresses for the new data (Step 360, No), then the data set is programmed with the new data at the addresses, and the ECC is set to the first predetermined value (e.g. 9'h00) indicating the first state to disable use of the ECC (Step 365). The first state is further described in connection with FIG. 4.

If the data set is blank at the addresses for the new data (Step 360, Yes), then it is determined whether the data set is programmed at the first address or the last address of the data set (Step 370). If the data set is programmed at the first address or the last address of the data set (Step 370, Yes), then it is further determined whether the data set is blank at addresses other than the addresses for the new data (Step 380). If not (Step 380, No), the new data and data previously programmed at other addresses in the data set can fill the data set. Consequently, a value is computed for the ECC of the selected data set, if a number of addressable segments storing the new data and data previously programmed in the selected data set includes at least a predetermined number of addressable segments (Step 385). The predetermined number can be all of addressable segments in the selected data set. At Step 390, the data set is programmed with the new data and the ECC computed for the selected data set.

If the data set is not programmed at the first address and not programmed at the last address of the data set (Step 370, No), or if the data set is blank at some addresses other than the addresses for the new data (Step 380, Yes), then the new data and the data previously programmed in the selected data set cannot fill the data set. Consequently, the new data is programmed (Step 375), but an ECC is not to be computed until the new data and the data previously programmed in the selected data set can fill the selected data set.

Hexadecimal and binary notations are used in this application. For example, "8'hFF" is a hexadecimal notation of an 8-bit binary number "8'b11111111", where each bit in the binary number has a value '1'. "8" in "8'hFF" or "8'b11111111" indicates the number of bits. "h" in "8'hFF" indicates hexadecimal, while "b" in "8'b11111111" indicates binary. Digits after "h" in "8'hFF" are hexadecimal digits. Digits after "b" in "8'b11111111" are binary digits. Hexadecimal digits include 16 values: 0, 1, 2, 3, 4, 5, 6, 7, 8, 9, A, B, C, D, E and F, equal to 0000, 0001, 0010, 0011, 0100, 0101, 0110, 0111, 1000, 1001, 1010, 1011, 1100, 1101, 1110, and 1111 in binary, respectively. Thus, "8'hFF", "8'h00", and "8'hC0" in hexadecimal are equal to "8'b11111111", "8'b00000000", and "8'b11000000" in binary, respectively. For another example, 1'b0 is a binary number including only 1 bit with a value '0', while 1'b1 is a binary number including only 1 bit with a value '1'.

Figure 4:
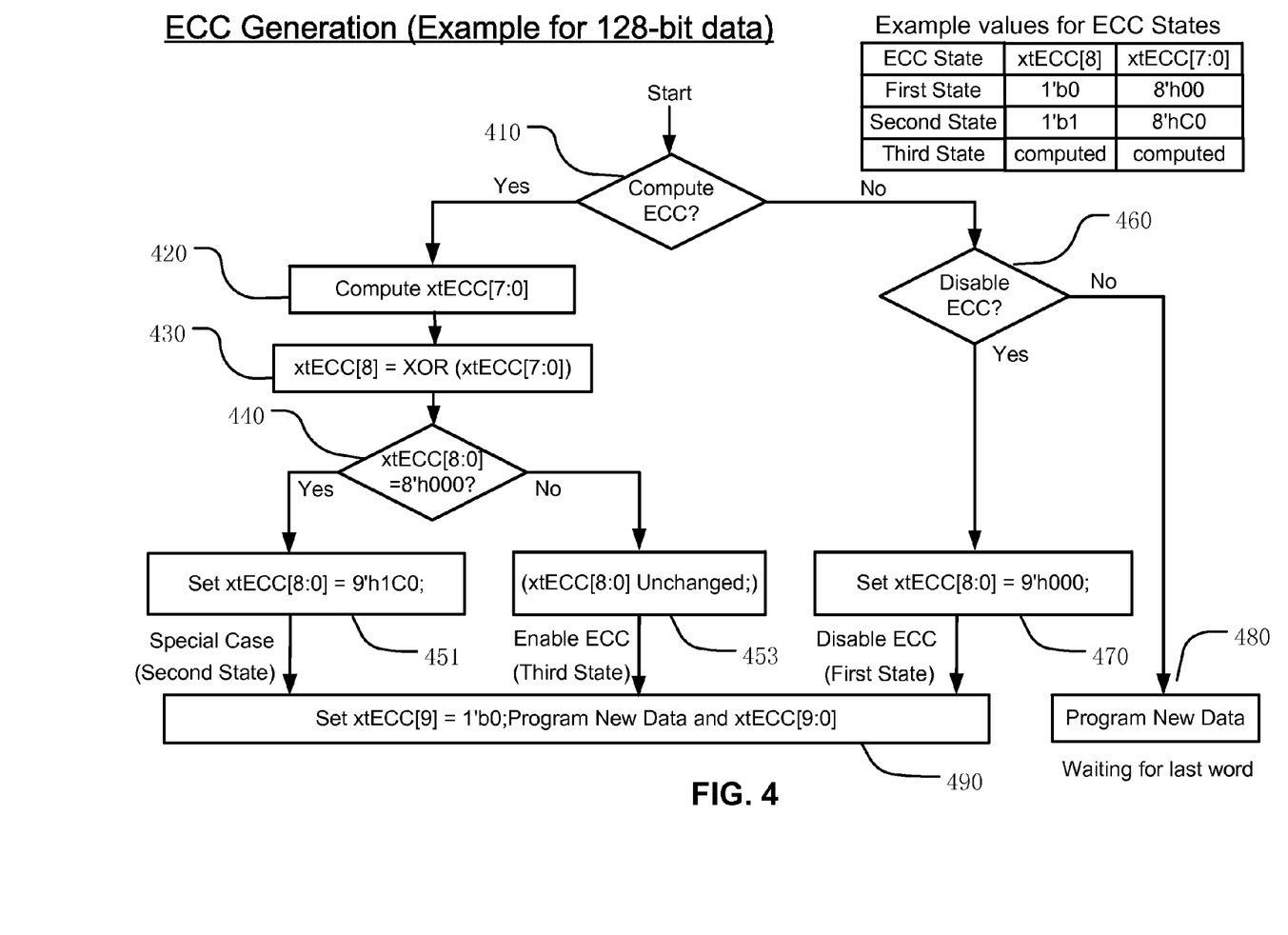
FIG. 4 is a flow chart for ECC generation using extended ECCs.

FIG. 4 is a flow chart for ECC generation using extended ECCs. In the example illustrated in FIG. 4, a data set has 128-bit data, and the ECC for the data has 8 bits. Indications can be stored with the data set that indicates whether to enable or disable use of the ECC stored with the data set. The indications can be provided by storing extended ECCs (e.g. xtECC[9:0] for 128-bit data), including a field for the ECCs (e.g. xtECC[7:0]) for the data sets, a field for a first additional ECC bit (e.g. xtECC[8]) derived from the ECC, and a field for a second additional ECC bit (e.g. xtECC[9]). The first additional ECC bit can be derived by executing a logical exclusive-OR function (XOR) on the ECC. The length of ECCs vary with the data size and consequently the length of extended ECCs vary with the data size. For instance, in an alternative implementation, ECCs for 256-bit data have 9 bits (e.g. xtECC[8:0]), and the extended ECCs for 256-bit data have 11 bits (e.g. xtECC[10:0]), including the first additional bit (e.g. xtECC[9]) and the second additional bit (e.g. xtECC[10]).

The extended ECCs can have a first predetermined value (e.g. 9'h000) indicating a first state to disable use of the data in the field for the ECCs, a second predetermined value (e.g. 9'h1C0) indicating a second state in which the extended ECCs originally have a computed value equal to the first predetermined value, and a computed value indicating a third state including computed ECCs in the field for the ECCs and a bit in the field for the first additional ECC bit derived from the computed ECC. In this example, both the first predetermined value and the second predetermined value are for the first additional bit and the ECCs in the extended ECCs corresponding to 128-bit data, The first, second and third states are summarized in a table in FIG. 4. The first state corresponds to the Yes branch of Step 460 and Step 470 when the ECC is set to the first predetermined value (e.g. 9'h000) to disable use of ECCs. The second state corresponds to the Yes branch of Step 440 and Step 451 when the ECC is set to the second predetermined value (e.g. 9'h1C0) to indicate the ECC originally has a computed value equal to the first predetermined value. The third state corresponds to the No branch of Step 440 and Step 453 when use of computed ECCs is enabled.

The flow for ECC generation starts at Step 410, where the decision on whether to compute an ECC for a data set is made by Steps 341, 343, 390, 375, and 365 as illustrated in FIG. 3. The decision can be to not compute an ECC (Step 410, No) as corresponding to Steps 375, 343, and 365, or to compute an ECC (Step 410, Yes) as corresponding to Steps 341 and 390, for reasons explained herein.

If the decision is to not compute an ECC (Step 410, No), it is further determined whether to disable use of the ECC for a read operation (Step 460). The decision can be to not disable use of the ECC for a read operation (Step 460, No), because partial data set program operations have not programmed a full data set (Step 375). If the decision is to not disable use of the ECC for a read operation (Step 460, No), then the new data as received at Step 305 is programmed in the memory, without storing any ECC for the new data (Step 480). The decision can be to disable use of the ECC for a read operation (Step 460, Yes), because a data set is not blank for a full data set program operation (Step 343), or because a data set is programmed at addresses for new data for a partial data set program operation (Step 365). If the decision is to disable use of the ECC for a read operation (Step 460, Yes), then at Step 470, the first additional bit and the ECC in the extended ECC for the data set is set to the first predetermined value (e.g. xtECC[8:0]=9'h000), thereby indicating to disable use of the ECC stored with the data set in a read operation.

If the decision at Step 410 is to compute an ECC (Step 410, Yes), as corresponding to Step 341 for a full data set program operation or corresponding to Step 390 for a partial data set program operation that programs the last word in a data set, then at Step 420 a value is computed for the ECC of the data set. At Step 430, the value is derived for the first additional ECC bit from the ECC. The value can be derived by executing a logical exclusive-OR function (XOR) on the ECC (e.g. xECC[8]=XOR (xtECC[7:0]). The extended ECC including the first additional ECC bit and the ECC can be used in a read operation to indicate whether to enable or disable use of the ECC stored with the data set.

At Step 440, it is determined whether the ECC equals the first predetermined value indicating the first state, as used in Step 470. If yes (Step 440, Yes), a special case occurs, where the computed value for the extended ECC can be 9'h000, corresponding to the first state at Step 470, and thus mistakenly indicating disabling use of the ECC. To solve the special case, the first additional bit and the ECC in the extended ECC are set to a second predetermined value (e.g.

xtECC[8:0]=9'h1C0) indicating a second state in which the extended ECC originally has a computed value equal to the first predetermined value. In a read operation as described in connection with FIG. 5, the special case is reversed (Steps 550 and 551, FIG. 5). If the ECC does not equal the first predetermined value indicating the first state, then at Step 453 the extended ECC including the first additional ECC bit and the ECC are unchanged.

Following Steps 451, 453, or 470, the second additional ECC bit can be set to a value indicating a programmed state (e.g. xtECC[9]=1'b0) to indicate that the selected data set is programmed in at least one addressable segment, and therefore the data set is not a blank data set. The second additional ECC bit can thus be used for protection of a blank data set as explained in connection with FIG. 5. The new data as received at Step 305, and the extended ECC (e.g. xtECC[9:0]) for the new data can be programmed in the data set in the memory (Step 490).

Figure 5:
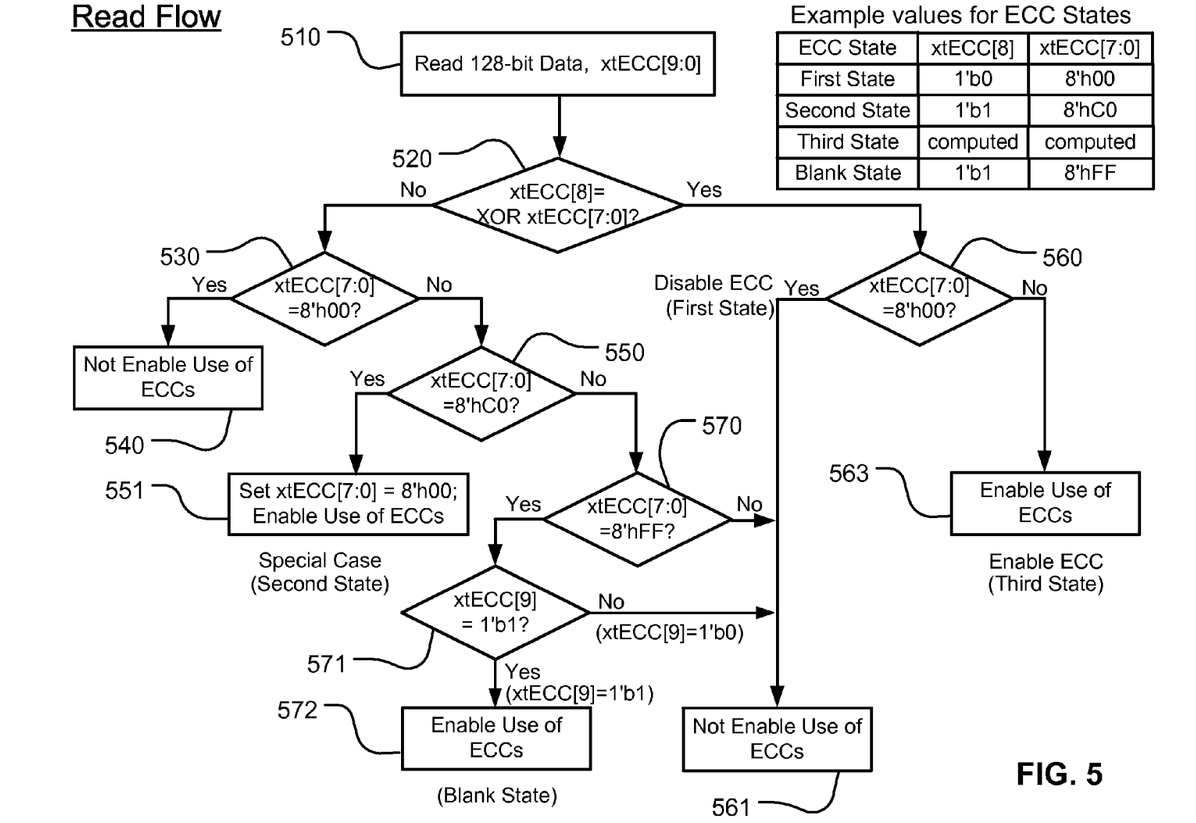
FIG. 5 is a flow chart for read operations using extended ECCs.

FIG. 5 is a flow chart for read operations using extended ECCs. In the example illustrated in FIG. 5, data (e.g. 128-bit data) in a data set, extended ECC (e.g. xtECC[9:0]) including an ECC (e.g. xtECC[7:0]) for the data in the data set, a first additional ECC bit (e.g. xtECC[8]), and a second additional ECC bit (e.g. xtECC[9]) are read from the memory (Step 510). The first additional ECC bit is derived from the ECC using a logical function. The same logical function used to derive the first additional ECC bit stored in the data set is executed on the ECC, and it is then determined whether the first additional ECC bit read from the data set equals the result from the logical function (Step 520).

The first state, the second state, the third state, and a blank ECC state as used in the read flow are summarized in a table in FIG. 5. The first state corresponds to the Yes branch of Step 560 and Step 561 when the use of ECCs are disabled. The second state corresponds to the Yes branch of Step 550 and Step 551 when the ECC is reversed to its original value equal to the first predetermined value indicating the first state. The third state corresponds to Step 563 when use of computed ECCs is enabled.

If the first additional ECC bit (e.g. xtECC[8]) read from the data set equals the result from the logical function (Step 520, Yes), it is further determined whether the ECC equals the first predetermined value indicating the first state (e.g. xtECC[7:0]=8'h00). If not (Step 560, No), the extended ECC (e.g. xtECC[8:0]) indicates that the data set is programmed with an ECC either by a full data set program operation (Step 341) or a partial data set program operation that programs the last word in the data set (Step 390). Consequently, use of the ECC stored with the data set is enabled (Step 563).

At Step 560, if the ECC equals the first predetermined value indicating the first state (e.g. xtECC[7:0]=8'h00), then use of the ECC stored with the data set is not enabled (Step 561), as the first state indicates to disable use of the data in the field for the ECC (Step 470, FIG. 4).

If the first additional ECC bit (e.g. xtECC[8]) read from the data set does not equal the result from the logical function (Step 520, No), it may indicate that the ECC equals the second predetermined value indicating the second state (xtECC[7:0]=8'hC0), the ECC equals the blank value (xtECC[7:0]=8'hFF) indicating the blank ECC state or the extended ECC has changed due to a retention error. It is further determined whether the ECC equals the first predetermined value indicating the first state (e.g. xtECC[7:0] =8'h00). If yes (Step 530, Yes), use of the ECC stored with the data set is not enabled (Step 540). If no (Step 530, No), it is further determined whether the ECC equals the second predetermined value indicating the second state (e.g. xtECC [7:0]=8'hC0) as set for the special case (Step 451, FIG. 4). If the ECC equals the first predetermined value indicating the second state (Step 550, Yes), the ECC is set to the first predetermined value (e.g. xtECC[7:0]=8'h00), and then use of the ECC stored with the data set is enabled (Step 551).

If the ECC does not equal the second predetermined value indicating the second state (Step 550, No), at Step 570, it is further determined whether the ECC equals the blank value indicating a blank ECC state (e.g. xtECC[7:0]=8'hFF). If the ECC does not equal the blank value indicating a blank ECC state, use of the ECC stored with the data set is not enabled (Step 561).

At Step 570, if the ECC equals the blank value indicating a blank ECC state (e.g. xtECC[7:0]=8'hFF), it is further determined whether the second additional ECC bit is programmed (e.g. xtECC[9]=1'b0) indicating the data set is not blank. If the data set is not blank (Step 571, No), use of the ECC stored with the data set is not enabled (Step 561). Since the data set is not blank, an error has occurred as indicated by the fact that the first additional ECC bit read from the data set does not equals the result from the logical function (Step 520, No). If the data set is blank (e.g. xtECC[9]=1'b1. Step 571, Yes), use of the ECC stored with the data set is enabled for a blank data set (Step 572), thus protecting a blank data pattern in a data set.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory comprising:
storing data sets including a plurality of addressable segments, and extended error correcting codes ECCs for the data sets in the memory, a particular extended ECC including a first field for an ECC derived from the corresponding data set and a second field for a first additional ECC bit derived from the ECC;
when writing new data in addressable segments of a selected data set in the memory, setting the extended ECC for the new data and data previously programmed in the selected data set, if a number of the addressable segments storing the new data and data previously programmed in the selected data set includes at least a predetermined number of addressable segments,
wherein the extended ECC is set to a first predetermined value to indicate a first state to disable use of the data in the first field, and the extended ECC is set to a second predetermined value to indicate a second state if the ECC derived from the corresponding data set and the first additional bit derived from the ECC are equal to the first predetermined value.

2. The method of claim 1, wherein the extended ECCs have a third state using a computed value for the extended ECC in which the first field stores an ECC derived from the corresponding data set and the second field stores a first additional ECC bit derived from the ECC in the first field.

3. The method of claim 1, comprising if an error condition occurs in which the selected data set is already programmed at the addressable segment for the new data, then setting the extended ECC to the first predetermined value.

4. The method of claim 3, comprising using the computed value, if data is programmed at a first addressable segment or a last addressable segment in the number of addressable segments of the selected data set, and programmed in addressable segments other than the addressable segments for the new data.

5. The method of claim 1, wherein the extended ECCs include a field for a second additional ECC bit, comprising setting the second additional ECC bit to a value to indicate the selected data set is programmed in at least one addressable segment.

6. A method of operating a memory storing data sets including a plurality of addressable segments, and error correcting codes ECCs for the data sets in the memory, comprising:
  reading an extended ECC including an ECC and a first additional ECC bit from a selected data set; and
  enabling use of the ECC stored with the selected data set, if output of a logical function of the ECC equals the first additional ECC bit, and the ECC does not equal a first predetermined value indicating a first state to disable use of the ECCs; and
  disabling use of the ECC stored with the selected data set, if the output of the logical function of the ECC equals the first additional ECC bit, and the ECC equals the first predetermined value indicating the first state to disable use of the ECCs.

7. The method of claim 6, comprising setting the ECC to the first predetermined value and then enabling use of the ECC with the selected data set, if the output of the logical function of the ECC does not equal the first additional ECC bit, and the ECC equals a second predetermined value indicating a second state in which the ECC originally has a computed value equal to the first predetermined value.

8. The method of claim 6, comprising:
  reading a second additional ECC bit that indicates whether the selected data set is programmed in at least one addressable segment or the selected data set is blank; and
  enabling use of the ECCs stored with the selected data set, if the output of the logical function of the ECC does not equal the first additional ECC bit, the ECC equals a blank value indicating a blank ECC state, and the second additional ECC bit indicates that the selected data set is blank.

9. A memory comprising:
  data sets including a plurality of addressable segments, and extended error correcting codes ECCs for the data sets in the memory, a particular extended ECC including a first field for an ECC derived from the corresponding data set and a second field for a first additional ECC bit derived from the ECC; and
  a controller coupled to the data sets, including logic which when writing new data in addressable segments of a selected data set in the memory, sets the extended ECC for the new data and data previously programmed in the selected data set and storing the ECC, if a number of the addressable segments storing the new data and data previously programmed in the selected data set includes at least a predetermined number of addressable segments,
  wherein the extended ECC is set to a first predetermined value to indicate a first state to disable use of the data in the first field, and the extended ECC is set to a second predetermined value to indicate a second state if the ECC derived from the corresponding data set and the first additional bit derived from the ECC are equal to the first predetermined value.

10. The memory of claim 9, wherein the extended ECCs have a third state using a computed value for the extended ECC in which the first field stores an ECC derived from the corresponding data set and the second field stores a first additional ECC bit derived from the ECC in the first field.

11. The memory of claim 9, wherein the controller includes logic to, if an error condition occurs in which data is already programmed at the addressable segment of the selected data set for the new data, set the extended ECC to the first predetermined value.

12. The memory of claim 9, wherein the extended ECCs include a field for a second additional ECC bit, and the controller includes logic to set the second additional ECC bit to a value to indicate the selected data set is programmed in at least one addressable segment.

13. The memory of claim 9, wherein the controller includes:
  logic to read an extended ECC including an ECC and a first additional ECC bit from a selected data set; and
  logic to enable use of the ECC stored with the selected data set, if output of a logical function of the ECC equals the first additional ECC bit, and the ECC does not equal a first predetermined value indicating a first state to disable use of the ECCs; and
  logic to disable use of the ECC stored with the selected data set, if the output of the logical function of the ECC equals the first additional ECC bit, and the ECC equals the first predetermined value indicating the first state to disable use of the ECCs.

14. A memory of claim 13, wherein the controller includes:
  logic to set the ECC to the first predetermined value and then enabling use of the ECC with the selected data set, if the output of the logical function of the ECC does not equal the first additional ECC bit, and the ECC equals a second predetermined value indicating a second state in which the ECC originally has a computed value equal to the first predetermined value.

15. The memory of claim 13, wherein the controller includes:
  logic to read a second additional ECC bit that indicates whether the selected data set is programmed in at least one addressable segment or the selected data set is blank; and
  logic to enable use of the ECCs stored with the selected data set, if the output of the logical function of the ECC does not equal the first additional ECC bit, the ECC equals a blank value indicating a blank ECC state, and the second additional ECC bit indicates that the selected data set is blank.

16. A method of operating a memory comprising:
  storing data sets including a plurality of addressable segments, and error correcting codes ECCs for the data sets in the memory;
  when writing new data in one of the addressable segments of a selected data set in the memory, computing and storing an ECC for the selected data set, if a number of addressable segments storing the new data and data previously programmed in the selected data set includes at least a predetermined number of addressable segments; and
  storing extended ECCs, including a field for said ECCs for the data sets and a field for a first additional ECC bit derived from the ECC,
  wherein the extended ECCs have a first predetermined value indicating a first state to disable use of the data in the field for said ECCs, a second predetermined value indicating a second state in which the extended ECCs originally have a computed value equal to the first predetermined value, and a computed value indicating a third state including computed ECCs in the field for the ECCs and a bit in the field for the first additional ECC bit derived from the computed ECC.

17. The method of claim 16, comprising:

setting the extended ECC to the first predetermined value, thereby indicating disabling use of the ECCs stored with the selected data set, if the selected data set is previously programmed at the addressable segment for the new data; and setting the extended ECC to the second predetermined value, if the extended ECC equals the first predetermined value and the selected data set is not programmed at the addressable segment for the new data.

18. A memory comprising:

data sets including a plurality of addressable segments, and error correcting codes ECCs for the data sets in the memory; and a controller coupled to the data sets, including logic which when writing new data in one of the addressable segments of a selected data set in the memory, computes and stores an ECC for the selected data set, if a number of addressable segments storing the new data and data previously programmed in the selected data set includes at least a predetermined number of addressable segments, wherein the controller includes logic to store extended ECCs, including a field for said ECCs for the data sets and a field for a first additional ECC bit derived from the ECC; and wherein the extended ECCs have a first predetermined value indicating a first state to disable use of the data in the field for said ECCs, a second predetermined value indicating a second state in which the extended ECCs originally have a computed value equal to the first predetermined value, and a computed value indicating a third state including computed ECCs in the field for the ECCs and a bit in the field for the first additional ECC bit derived from the computed ECC.

19. The memory of claim 18, wherein the controller includes:

logic to set the extended ECC to the first predetermined value, thereby indicating disabling use of the ECCs stored with the selected data set, if the selected data set is previously programmed at the addressable segment for the new data; and logic to set the extended ECC to the second predetermined value, if the extended ECC equals the first predetermined value and the selected data set is not programmed at the addressable segment for the new data.

* * * * *